United States Patent
Schmidt et al.

(10) Patent No.: US 9,007,460 B2
(45) Date of Patent: Apr. 14, 2015

(54) METHODS AND SYSTEMS FOR PREDICTING CLOUD MOVEMENT

(75) Inventors: Michael Schmidt, Bavaria (DE); Christian Maria Anton Heller, Bavaria (DE); Oliver Gerhard Mayer, Bavaria (DE); Marcus Zettl, Aying (DE); Omar Ivan Stern Gonzalez, Bavaria (DE); Yaru Najem Mendez Hernandez, Bavaria (DE); Mark Ronald Lynass, Bavaria (DE); Eva Bernal Serra, Bavaria (DE); Marianne Hartung, Bavaria (DE)

(73) Assignee: General Electric Company, Niskayuna, NY (US)

( * ) Notice: Subject to any disclaimer, the term of this patent is extended or adjusted under 35 U.S.C. 154(b) by 363 days.

(21) Appl. No.: 13/434,866

(22) Filed: Mar. 30, 2012

(65) Prior Publication Data
US 2013/0258068 A1 Oct. 3, 2013

(51) Int. Cl.
H04N 7/18 (2006.01)
H04N 13/02 (2006.01)
F24J 2/40 (2006.01)
G01W 1/10 (2006.01)
H01L 31/02 (2006.01)

(52) U.S. Cl.
CPC ............... *H04N 13/0203* (2013.01); *F24J 2/40* (2013.01); *G01W 1/10* (2013.01); *H04N 7/18* (2013.01); *F24J 2200/04* (2013.01); *Y02E 10/40* (2013.01); *H01L 31/02021* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 5,585,632 A | 12/1996 | Hull et al. | |
| 7,894,044 B1 | 2/2011 | Sullivan | |
| 8,000,521 B2 | 8/2011 | Kira | |
| 2004/0169770 A1 | 9/2004 | Widener et al. | |
| 2010/0198420 A1 | 8/2010 | Rettger et al. | |
| 2010/0309330 A1* | 12/2010 | Beck | 348/222.1 |
| 2011/0220091 A1* | 9/2011 | Kroyzer | 126/572 |
| 2012/0121125 A1* | 5/2012 | Dimov | 382/103 |

FOREIGN PATENT DOCUMENTS

| | | | |
|---|---|---|---|
| EP | 1600890 A2 * | 11/2005 | ............... G06T 5/00 |
| JP | 2007184354 A | 7/2007 | |

OTHER PUBLICATIONS

McGuffie, K. et al., Almost a Century of "Imaging" Clouds Over the Whole-Sky Dome. Bull. Amer. Meteor. Soc., 70, 1243-1253, 1989.*

(Continued)

*Primary Examiner* — Sath V Perungavoor
*Assistant Examiner* — Dakshesh Parikh
(74) *Attorney, Agent, or Firm* — Seema S. Katragadda

(57) ABSTRACT

A prediction system for predicting solar irradiance based on cloud characteristics includes a sky imager that includes a customized lens configured to capture one or more substantially planar images of the sky. The prediction system further includes an image processor coupled to the sky imager and configured to process the one or more substantially planar images. Moreover, the prediction system includes a computing system coupled to the image processor and configured to detect cloud characteristics based on the one or more substantially planar images, and predict the solar irradiance based on the cloud characteristics.

17 Claims, 4 Drawing Sheets

(56) References Cited

OTHER PUBLICATIONS

Chi Wai Chow et al., Intra-hour forecasting with a total sky imager at the UC San Diego solar energy testbed, Solar Energy, vol. 85, Issue 11, pp. 2881-2893, Nov. 2011; and.*

Lenz, Reiner, et al., "If I had a fisheye I would not need SO(1, n), or is hyperbolic geometry useful in image processing?" Proc. of the SSAB Symposium, Uppsala, Sweden, 1998.*

K. Miyamoto, "Fish Eye Lens," J. Opt. Soc. Am. 54, 1060-1061, 1964.*

Yamashita et al., "Cloud Cover Estimation using Multitemporal Hemisphere Imageries", Commission VII, WG VII/6, vol. 35, pp. 826-829, 2004.

Feister et al., "Ground-Based Cloud Images and Sky Radiances in the Visible and Near Infrared Region From Whole Sky Imager Measurements", Proceedings of climate Monitoring—Faculty Training Workshop, 2000; 10 Pages.

Martins et al., "Estimation and Prediction of Cloudiness from Ground-Based All-Sky Hemispherical Digital Images". URL : csi.fct.ualg.pt/membros/pfrazao/papers/EAPO10.pdf; Proceedings of CONTROLO'2010, the 9th Portuguese Conference on Automatic Control, Sep. 2010, Coimbra, Portugal; 6 Pages.

George et al., "Short-Range Solar Radiation Forecasts in Support of Smart Grid Technology", Atmospheric and Environmental Research, Inc.; URL : ams.confex.com/ams/pdfpapers/161687.pdf; 2010—ams.confex.com; 5 Pages.

Search Report and Written Opinion from corresponding EP Application No. 13161715.1-1557 dated Jun. 19, 2013.

Wikipedia: "Fisheye lens", Feb. 4, 2012.

Kassianov et al., "Cloud-Based Height Estimation from Paired Ground-Based Hemispherical Observations," Journal of Applied Meteorology, vol. 44, pp. 1221-1233 (Aug. 2005).

Allmen et al., "The computation of cloud base height from paired whole-sky imaging cameras," Machine Vision and Applications, vol. 9, pp. 160-165 (1997).

Chow et al., "Intra-hour forecasting with a total sky imager at the UC San Diego solar energy testbed," Solar Energy, vol. 85, pp. 2881-2893 (2011).

Seiz, "Ground- and Satellite-Based Multi-view Photogrammetric Determination of 3D Cloud Geometry," Doctoral Dissertation, Swiss Federal Institute of Technology Zurich, Diss. ETH No. 15172 (2003).

* cited by examiner

METHODS AND SYSTEMS FOR PREDICTING CLOUD MOVEMENT

BACKGROUND

Embodiments of the present disclosure relate to solar energy, and more particularly to measurement, calculation, and prediction of cloud characteristics such as cloud movement.

Images of the sky, commonly referred to as 'sky images,' are employed in diverse applications. For example, astronomers utilize sky images for analyzing cosmic movements and meteorological departments use these images to predict local weather conditions. Similarly, in one application, sky images may be utilized to observe the sun and clouds and to predict cloud cover, cloud movement over a given period, and solar radiation received at a particular location over a given time period. Determination of such cloud characteristics and solar irradiance may be employed in solar plants (employing solar panels or photovoltaic power grids) to ascertain or predict power output of the grid for particular time intervals and to control the grid output based on cloud movement. For example, when a cloud's shadow falls on the solar panels, the shadow may partially or completely block sunlight, thereby limiting the power output of the solar panels. During this time, the solar plant may need to operate auxiliary energy sources, such as batteries or thermal power plants to maintain the power output of the solar plant. Once the cloud cover drifts away, the auxiliary power source may be disconnected, and power may once again be provided by the solar panels.

The prediction of cloud movement, however, is technically challenging. By way of example, since the sky typically spans over a wide angle of view, the movement of distant low clouds may not be easily detected. For instance, it may be difficult to calculate the velocity, size, and orientation of clouds near the horizon. Conventional sky-imaging devices typically utilize a combination of standard digital camera sensors with wide-angle lenses such as conventional fish-eye lenses or hemispherical mirrors to capture a large part of the visible sky. These wide-angle lenses, however, fail to accurately detect cloud movement of low-lying and fast-moving clouds at the circumference of the lens and therefore may not be able to effectively capture cloud movement. In particular, the images captured by these lenses are compressed near the circumference of the lens (i.e., a large portion of the sky near the horizon is mapped to a relatively small part of the camera sensor) and expanded near the center of the lens (i.e., a small portion of the sky is mapped to a relatively larger part of the camera sensor). Therefore, in an image, a large cloud at the horizon may appear relatively smaller than a smaller cloud present at the center of the lens. Moreover, a relatively larger movement of higher velocity clouds at the circumference of the lens may appear smaller than a relatively smaller movement of lower velocity clouds at the center of the lens.

A large prediction horizon is a desirable feature of a prediction system as that allows corrective actions to be initiated as early as possible. Prediction time refers to the amount of time in which a prediction system is able to determine an occlusion event (i.e., when a cloud cover shades the solar panels) before the event occurs. So, in order to predict an occlusion event as early as possible, it is desirable that the prediction system detect clouds as early as possible. To this end, it is desirable that the lens detects clouds and determines their characteristics when the clouds are as far away from the solar plant as possible. Timely calculations are desired because these calculations may be utilized for further computations and/or actions. For example, based on the computed cloud characteristics, the prediction system may be configured to estimate the solar irradiance received by the solar panels and the electric power output of the solar panels during an occlusion event. Additionally, based on the power output so computed, the prediction system may be configured to determine whether there is a need for auxiliary power sources. As will be appreciated, certain auxiliary sources, such as thermal power sources may reach a steady state in a determined time subsequent to being powered on. If these auxiliary sources do not reach steady state before the occlusion event, the power output of the solar plant may disadvantageously fall below a threshold value. In a conventional fish-eye lens, because of the compressive property of the lens, the prediction horizon is small. Consequently, cloud movement and other characteristics are not easily discernible when the cloud is near the horizon. Waiting for the cloud to reach the center of the lens, where the cloud movement and other characteristics are easily discernible, results in a delay in the computation of power output. Accordingly, there may be a delay in energizing an auxiliary source and allowing the auxiliary source to reach steady state, thereby reducing the power output of the solar plant.

BRIEF DESCRIPTION

In accordance with one aspect of the present disclosure, a prediction system for predicting solar irradiance based on cloud characteristics is presented. The system includes a sky imager that includes a customized lens configured to capture one or more substantially planar images of the sky. The prediction system further includes an image processor coupled to the sky imager and configured to process the one or more substantially planar images. Moreover, the prediction system includes a computing system coupled to the image processor and configured to detect cloud characteristics based on the one or more substantially planar images and predict the solar irradiance based on the cloud characteristics.

In accordance with another aspect of the present disclosure, a prediction system is presented. The prediction system includes a sky imager, where the sky imager includes a customized lens having a projection map given by the equation:

$$R(\theta) = 2 \times f \times \frac{\sin\left(\frac{\theta}{2}\right)}{\cos\left(\frac{\theta}{2}\right)^{\gamma}}$$

or approximations thereof; where, R is a position of an image point on an image sensor, $\theta$ is an angle of observation of the customized lens, f is the focal length, and $\gamma$ is a constant, such that $0<\gamma\leq1$.

In accordance with yet another aspect of the present disclosure a method for predicting power output of one or more solar panels in a solar plant based on cloud characteristics is presented. The method includes capturing a plurality of images of the sky using a customized lens having a projection map given by the equation $$R(\theta) = 2 \times f \times \frac{\sin\left(\frac{\theta}{2}\right)}{\cos\left(\frac{\theta}{2}\right)^{\gamma}}$$

or approximations thereof. Further, the method includes determining the cloud characteristics based on the plurality of captured images and predicting solar irradiance corresponding to the one or more solar panels based on the determined cloud characteristics. Moreover, the method includes calculating power output of the one or more solar panels based on the predicted solar irradiance. A non-transitory computer readable medium including one or more tangible media, where the one or more tangible media include code adapted to perform the method for predicting power output of one or more solar panels in a solar plant based on cloud characteristics is also presented.

DRAWINGS

These and other features, aspects, and advantages of the present disclosure will become better understood when the following detailed description is read with reference to the accompanying drawings in which like characters represent like parts throughout the drawings, wherein.

Figure 5:
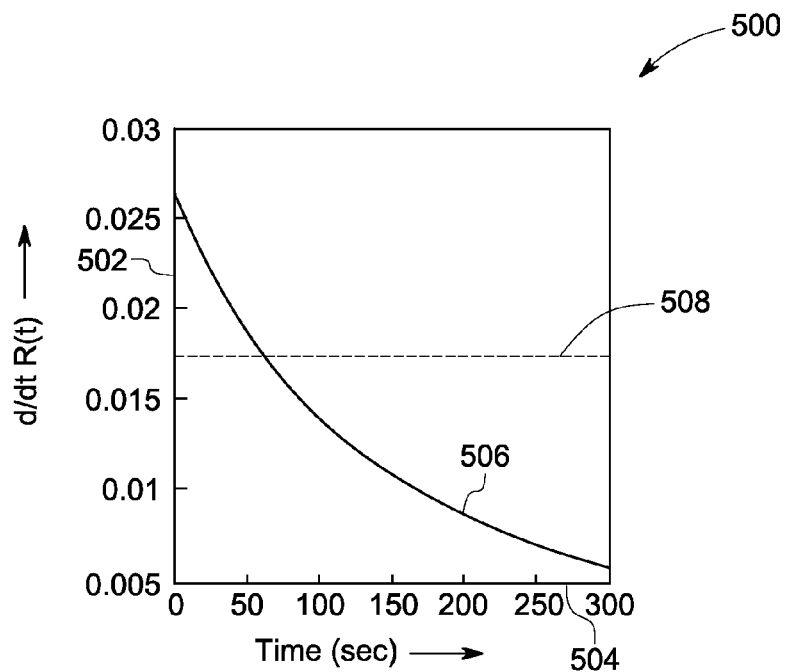
Figure 6:
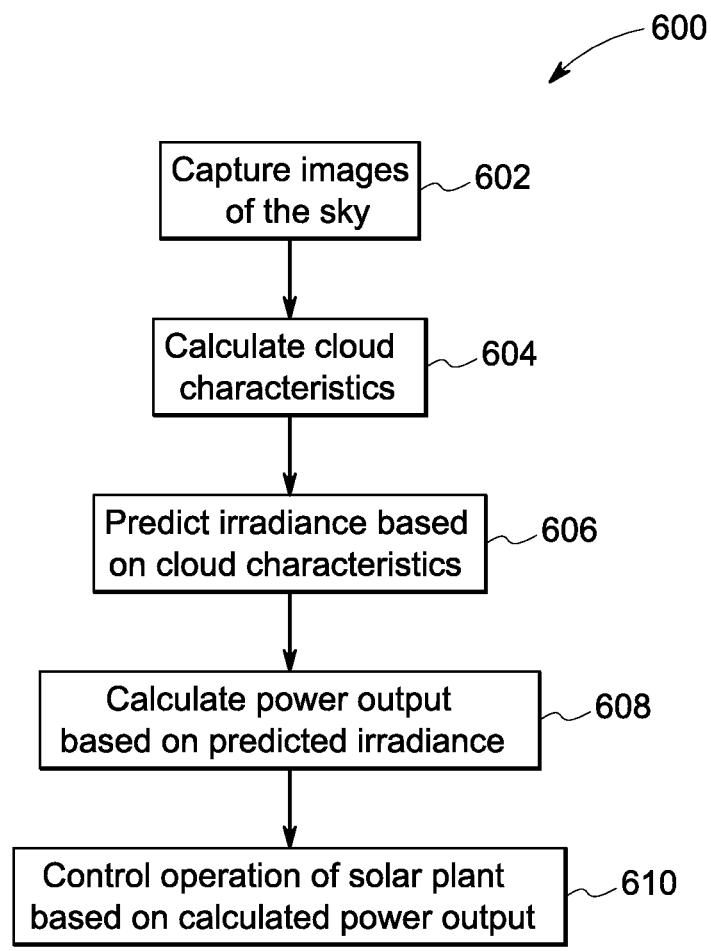

FIG. 5 is a diagrammatical representation illustrating a relation between a rate of change of an image point position on an image sensor and time for an exemplary cloud moving towards an exemplary stereographic lens, according to aspects of the present disclosure; and FIG. 6 is a flowchart illustrating an exemplary method for predicting power output of a solar plant based on cloud movement, according to aspects of the present disclosure.

DETAILED DESCRIPTION

Embodiments of the present disclosure are related to systems and methods for predicting/estimating cloud movement using optimized optics. It will be noted that throughout this disclosure the terms 'predict' and 'estimate' have been interchangeably used. Further, as used herein, the term 'irradiance' refers to the density of solar terrestrial radiation incident on a given surface. The irradiance is typically expressed in watts per square centimeter or square meter.

Moreover, embodiments of the present disclosure are described with respect to predicting solar irradiance for a solar plant in case of occlusion events. The term 'occlusion event', as used herein, refers to events or duration of time for which a cloud cover shades one or more solar panels in the solar plant. It will be understood that the systems and methods to predict cloud movement described herein may be utilized in other applications as well. For example, these systems may be utilized in meteorological centers to determine weather changes, and so on.

As will be appreciated, in solar plants, it may be desirable to accurately calculate or predict the amount of irradiance received by the solar plant at any given time. Based on the calculated or predicted irradiance, the solar plant may control plant operation or the load placed on the solar panels to maintain the output power of the solar plant above a threshold level. To predict irradiance, weather conditions such as extent of cloud cover, cloud movement, transmissivity of the cloud, and/or velocity of cloud movement may be utilized. Transmissivity refers to a degree to which a cloud allows radiation to pass through it. Typical prediction systems capture multiple images of the sky and based on the relative position of the clouds in the images, the prediction systems may identify the type of clouds and/or predict cloud movement. However, these prediction systems employ conventional fish-eye lenses or hemispherical mirrors and therefore predict cloud movement with a very long prediction time.

It may be desirable to create a substantially uniform and accurate sky image as early as possible to have a large prediction horizon. To that end, embodiments of the present disclosure employ exemplary customized lenses and/or mirrors coupled with image sensors to obtain images of a relevant field of view and produce high resolution images. The customized lenses capture one or more substantially planar images of the sky. As used herein, the term 'planar image' refers to an image in which a distance between two object points X and Y in a horizontal plane of a certain height corresponds to a certain distance between image points x and y on the image sensor, and where the relation of the distance (x, y) to the distance (X, Y) is independent of the distance between the object points and the customized lens. Moreover, as used herein, the term 'substantially planar image' refers to planar images and approximations of planar images.

Figure 1:
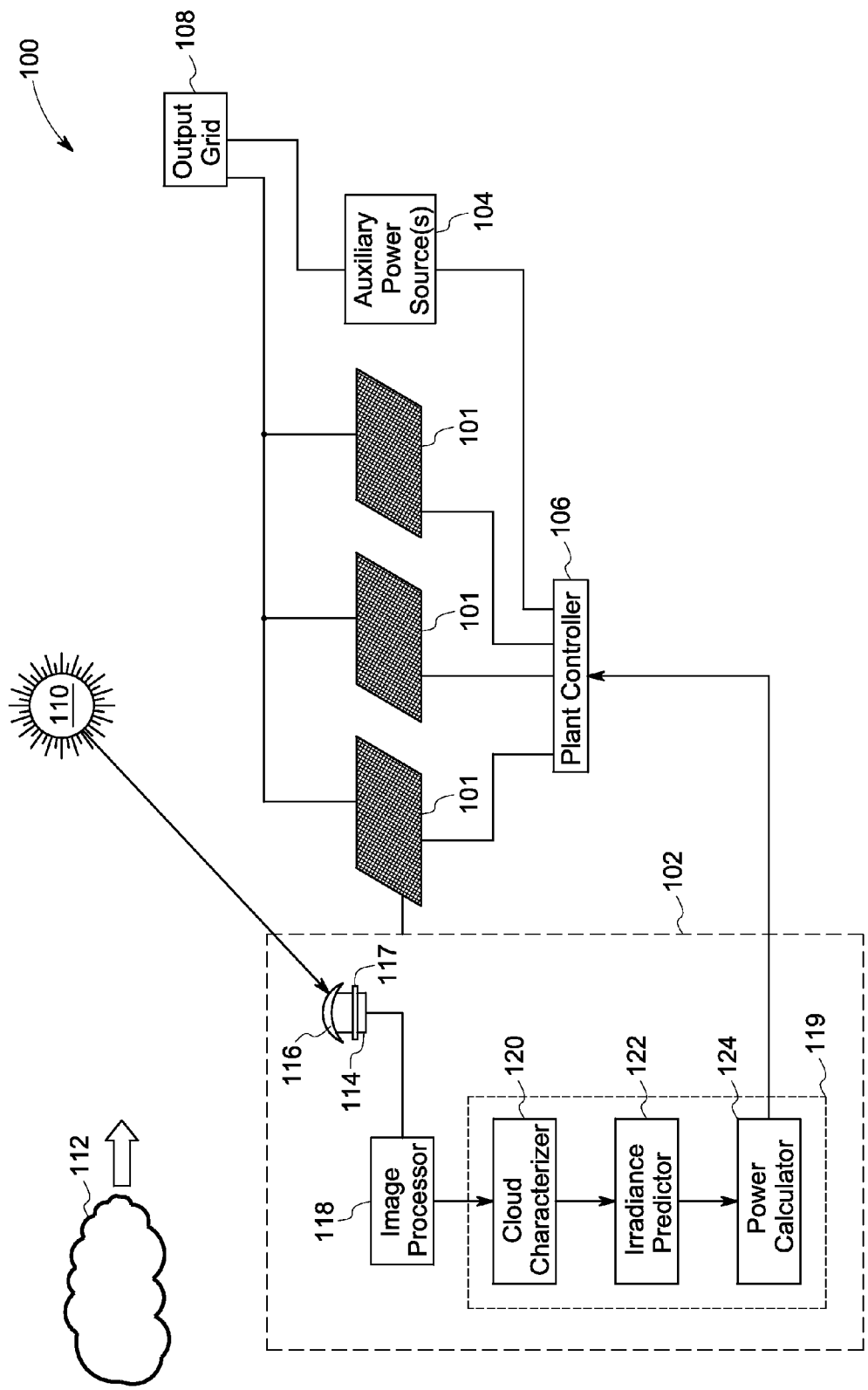
FIG. 1 is a diagrammatical representation illustrating an exemplary solar plant, according to aspects of the present disclosure.

FIG. 1 is a diagrammatical representation of a solar plant 100 that includes an exemplary prediction system 102. The solar plant 100 may include one or more solar panels 101. The one or more solar panels 101 may be located in the same geographical location or they may be physically separated from one another. By installing the solar panels 101 at separate locations, the solar plant 100 may take advantage of the fact that at any given point of time, some solar panels 101 may receive full irradiance while others may face an occlusion event. Alternatively, by installing the solar panels 101 in the same location, installation and operating costs may be reduced. In case the solar panels 101 are installed at different locations, each solar panel cluster that includes one or more solar panels 101 may include one or more corresponding prediction systems 102. However, in certain embodiments, more than one prediction system 102 may be employed for a cluster of solar panels 101. It will be appreciated that for clarity FIG. 1 illustrates only one prediction system 102. However, in some embodiments, the solar panels 101 may be coupled to separate prediction systems 102 or have more than one prediction system 102 per solar panel 101 during operation.

The solar plant 100 may further include one or more auxiliary power sources 104 such as a thermal power plant, one or more fuel cells, a gas turbine, batteries, or any other such source. The solar panels 101 and the auxiliary power source 104 may be coupled to a plant controller 106 that controls the operation of the solar plant 100. Further, the solar panels 101 and the auxiliary power source 104 may be coupled to an output grid 108. In some instances, electronic power converters may be installed to couple the solar panels 101 and the auxiliary power sources 104 to the output grid 108. The output grid 108 in turn operationally couples the solar plant 100 to an external electrical circuit (not shown). FIG. 1 further illustrates exemplary positions of the sun 110 and a low lying distant cloud 112. In the present example, the cloud 112 may be a slow moving cloud moving towards the prediction system 102. Again, for clarity, only one cloud 112 is illustrated. It will be appreciated, however, that during operation the sky may include more than one cloud at different positions and heights from the ground. Further, on clear days, no clouds may be present in the sky.

Additionally, in certain embodiments, the prediction system 102 may include one or more sky imagers 114. In accordance with exemplary embodiments of the present disclosure, the sky imager 114 may include an exemplary customized lens 116 and an image sensor 117. Also, the sky imager 114 may be configured to acquire one or more images of the sky. Further, the prediction system 102 may include an image processor 118 that is operatively coupled to the sky imager 114. The image processor 118 may be configured to process the one or more images of the sky captured by the sky imager 114 and the image sensor 117, in particular. The prediction system 102, in one example, may also include a computing system 119 configured to detect cloud movement and predict solar irradiance. In a presently contemplated configuration, the computing system 119 may include a cloud characterizer 120, an irradiance predictor 122, and a power calculator 124.

It may be noted that an output of the image processor 118 may be communicated to the computing system 119 and in particular, to the cloud characterizer 120. Moreover, an output from the cloud characterizer 120 may be communicated to the irradiance predictor 122, which may be, in turn, coupled to the power calculator 124. Output from the power calculator 124 may be provided to the plant controller 106. It may be noted that although FIG. 1 depicts various modules of the prediction system 102 as separate entities, in other embodiments, the modules may not be separate entities and some or all of the functions performed by these modules may be performed by an individual computing device (not shown). In yet another embodiment, one or more modules may be combined to form a single module that performs the functions of combined modules. For example, the irradiance predictor 122 and power calculator 124 modules may be combined into a single power predictor module (not shown) without departing from the scope of the present disclosure.

The sky imager 114 may be configured to periodically or continuously capture images of the sky using the customized lens 116 and the image sensor 117. It will be appreciated that the image sensor 117 may be an array of complementary metal-oxide-semiconductor (CMOS), charge-coupled device (CCD) elements, or any other elements capable of converting an optical image into electrical signals. In one embodiment, a projection map of the customized lens 116 may be given by equation (1):

$$R(\theta) = 2 \times f \times \frac{\sin\left(\frac{\theta}{2}\right)}{\cos\left(\frac{\theta}{2}\right)^\gamma} \quad (1)$$

where R is a position of an image point on the image sensor 117, f is the focal length of the customized lens 116, θ is an observation angle, and γ is a constant such that $0 < \gamma \leq 1$.

It may be noted that when γ has a value of 1, the customized lens behaves as an exemplary stereographic lens. A stereographic lens exhibits a high resolution at the edge of the lens and lower resolution towards the center of the lens. Further, the stereographic lens may have a substantially homogeneous profile, allowing motion at the edge of the lens to be captured in a more linear fashion. For example, the stereographic lens may depict the actual size of the clouds and more accurately depict cloud movement at the circumference of the lens. For γ values between 0 and 1, the resolution at the edge of the lens may be lower than that corresponding to a stereographic lens and the resolution at the center of the lens may be higher than that for a stereographic lens. It will be understood that for γ values between 0 and 1, the lens provides an intermediary solution between a conventional fish-eye lens employed in the currently available solutions and the exemplary stereographic lens utilized in the present disclosure.

Figure 2:
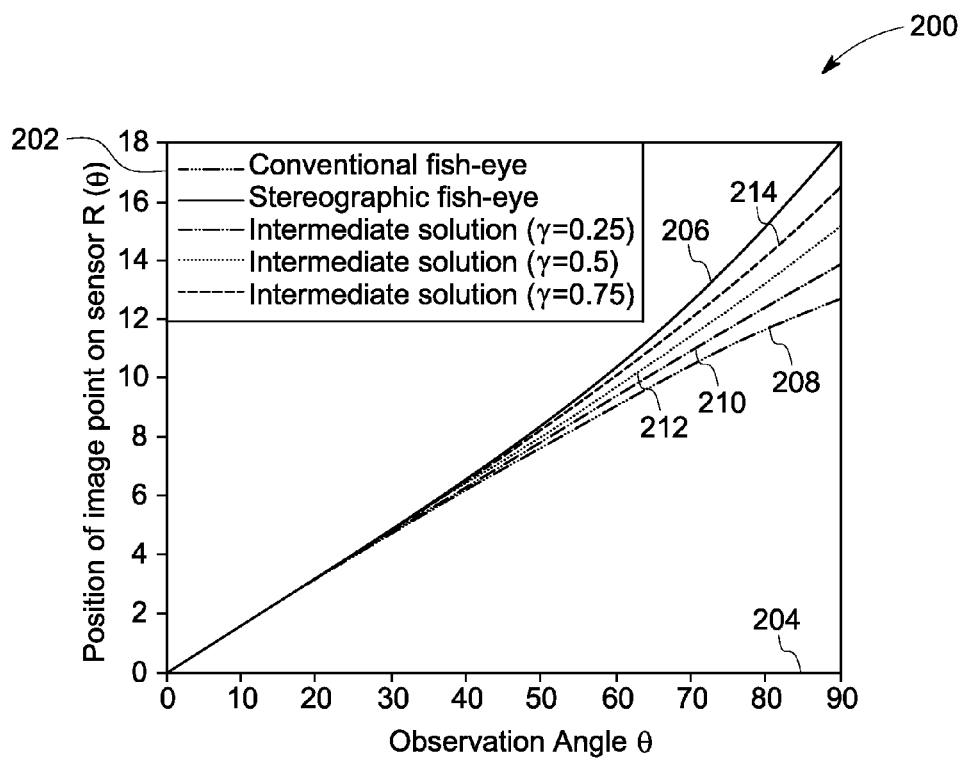
FIG. 2 is a diagrammatical representation illustrating a comparison of mapping functions for exemplary customized lenses and a conventional fish-eye lens.

FIG. 2 is a graph 200 illustrating a comparison of mapping functions of the customized lenses (including the stereographic lens and intermediary lenses) and the conventional fish-eye lens. More particularly, the mapping function is illustrated as a function of an observation angle (θ) corresponding to a cloud, such as the cloud 112 (see FIG. 1) and a position of an image point corresponding to the cloud 112 on the image sensor 117. It will be appreciated that the mapping function is a function of the focal length of the lenses, and therefore this graph 200 illustrates a qualitative relationship between the various lenses and not a quantitative relationship. Further, it is assumed that the cloud 112 travels from the horizon towards the sky imager 114 along a straight line. For such a movement, the observation angle θ varies from about 90° to about 0°.

The vertical axis 202 is representative of a position of the image point corresponding to the cloud 112 and the horizontal axis 204 is representative of the observation angle θ. Further, curve 206, corresponding to a stereographic lens (γ=1), indicates that the position of the image point (R) on the image sensor 117 increases substantially over-proportionally as the observation angle (θ) increases. This curve 206 indicates that when the cloud 112 is further away from the sky imager 114, the image point (R) corresponding to the cloud 112 moves a larger distance on the image sensor 117 than when the cloud 112 is closer to the sky imager 114. Curve 208 corresponds to the conventional fish-eye lens. This curve 208 illustrates that the position of the image point (R) decreases substantially under-proportionally as the observation angle (θ) increases. The curve 208 indicates that when the cloud 112 is further away from the sky imager 114, the image point (R) corresponding to the cloud 112 moves a smaller distance on the image sensor 117 than when the cloud 112 is closer to the sky imager 114. Therefore, stereographic lenses may detect movement in low-lying, distant clouds more easily than conventional fish-eye lenses. For the intermediary lenses, having a γ value between 0 and 1 (curves 210, 212, 214), the position of the image point (R) increases substantially linearly with respect to the observation angle (θ), indicating that the image point (R) moves substantially proportionally with the movement of the cloud 112 in the sky.

Moreover, the term stereographic lens is used to refer to the customized lens 116, where the stereographic lens has a γ value of 1. It will be understood, however, that, the stereographic lens 116 may be easily replaced by the intermediary lenses having γ values between 0 and 1 without departing from the scope of the present disclosure. The projection map of the stereographic lens 116 may be given by equation (2):

$$R(\theta) = 2 \times f \times \tan\left(\frac{\theta}{2}\right) \quad (2)$$

Figure 3:
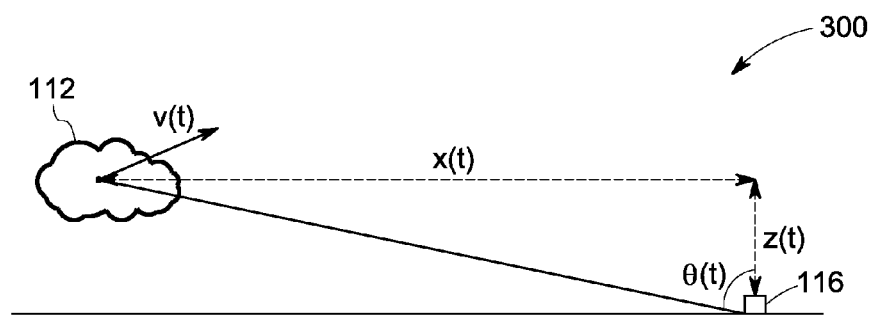
FIG. 3 is a diagrammatical representation illustrating an exemplary position of a cloud with respect to an exemplary stereographic lens.

FIG. 3 is a diagrammatical representation 300 illustrating a position of the cloud 112 with respect to the stereographic lens 116. Here, z(t) represents the height of the cloud 112 from the stereographic lens 116 or the vertical motion vector of the cloud 112. Further, x(t) represents the horizontal distance of the cloud 112 from the stereographic lens 116 or the horizontal motion vector of the cloud 112. The observation angle, varying from about 90° to about 0°, is represented by θ, and the velocity (including vertical and horizontal velocity) of the cloud 112 is represented by v(t). In such a case, a linear map of the image projected by the stereographic lens 116 may be given by equation (3):

$$R(\theta(t)) = f \times \frac{x(t)}{z(t)} \qquad (3)$$

Assuming that the cloud 112 moves towards the stereographic lens 116 at a constant height, i.e., velocity in the vertical direction is zero ($v_z$=0), the rate of change of the observation angle (d(θ)/dt) may remain constant for all values of cloud position. Plotting the rate of change of observation angle θ against the cloud position results in a straight line, which is indicative of a homogeneous profile of the stereographic lens. Accordingly, even when the cloud 112 moves both horizontally and vertically, i.e., $v_z \neq 0$, the rate of change of the image point on the image sensor 117 is substantially improved as compared to a conventionally employed hemispherical mirror or fish-eye lens.

Figure 4:
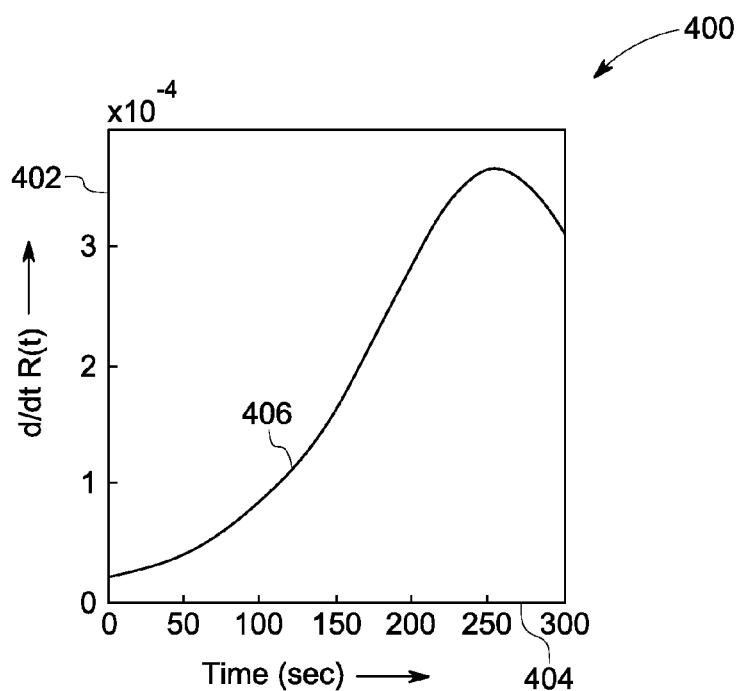
FIG. 4 is a diagrammatical representation illustrating a relation between a rate of change of an image point position on an image sensor and time for an exemplary cloud moving towards a conventional fish-eye lens.

FIGS. 4 and 5 illustrate a comparison of a rate of change of a position of an image point (dR/dt) of a moving cloud captured by a conventional fish-eye lens and the exemplary stereographic lens 116. More particularly, FIG. 4 is a diagrammatic representation 400 illustrating the rate of change of the image point (R) with respect to time t for a conventional fish-eye lens corresponding to a particular cloud, such as the cloud 112 of FIG. 1. Also, FIG. 5 is a diagrammatical representation 500 illustrating the rate of change of the image point (R) with respect to time t for the stereographic lens 116 for the same cloud 112. The vertical axes 402, 502 represent the rate of change of the image point (dR/dt) in the captured image, while the horizontal axes 404, 504 represent time t in FIGS. 4 and 5, respectively. It may be presumed that at time t=0 second, the cloud 112 is positioned at the edge of the lens and at time t=250 seconds (approximately 4 minutes) the cloud 112 is positioned directly over the lens. Further, in the graphs 400, 500, it is also assumed that the cloud 112 moves horizontally and vertically (i.e., the cloud motion has both horizontal and vertical motion vectors).

In accordance with aspects of the present disclosure, relating the rate of the change of the image point (dR/dt) with the physical size of individual pixels of the captured image allows computation of time taken by the image point to travel from one pixel to another. Furthermore, a higher rate of change of the position of the image point results in relatively faster changes of the cloud position in the images. These relatively faster changes may be easily discerned, thereby facilitating faster computation of the cloud movement. A lower rate of change of the position of the image point, on the other hand, results in relatively slower changes of the cloud position in the images. The lower rate of change hinders the discernment of cloud movement and extraction of relevant information. As illustrated in the graph 400, the rate of change of the position of the image point (depicted as curve 406) corresponding to the conventional fish-eye lens is very low when the cloud 112 is at the horizon (i.e., at time t=0 s) and gradually increases as the cloud 112 approaches the center of the fish-eye lens (i.e., at time t=250 s). Therefore, as described previously, in a conventional fish-eye lens, cloud movement is not easily discernible at the edge of the lens. However, as the image of the cloud moves towards the center of the conventional fish-eye lens, the cloud movement is more easily discernible.

Referring now to the graph 500 of FIG. 5, a rate of change of the position of the image point (depicted as solid curve 506) for the stereographic lens 116 is high towards the edge of the stereographic lens 116 (i.e., time t=0 s) and gradually decreases as the cloud 112 moves towards the center of the lens 116 (i.e., at time t=250 s). In case the cloud 112 moves towards the stereographic lens 116 at a constant height, the rate of change of the position of the image point (depicted as dotted line 508) tends to be substantially linear and constant over time. This graph 500 indicates that greater movement in the position of the cloud 112 may be captured by the stereographic lens 116 when the cloud 112 is near the horizon, thereby aiding the image processor 118 in easily discerning cloud movement and calculating cloud characteristics. Also, as the cloud 112 moves towards the lens 116, a smaller movement in the position of the cloud 112 may be captured.

In accordance with further aspects of the present disclosure, the projection map and the specific curvature of the stereographic lens 116 as defined by equation (2) allows the stereographic lens 116 to capture planar images of the whole sky including the cloud 112 present at the edge of the stereographic lens 116. Further, use of the stereographic lens 116 allows the lens to capture one or more images of the cloud 112 and identify a large enough displacement in the position of the cloud 112 between consecutive images. The discernible displacement may aid in extracting relevant motion information. As depicted in the graph 500, the rate of change of the observation angle is higher at time t=0 seconds (when the cloud 112 is near the edge of the stereographic lens 116) and gradually decreases as the cloud 112 moves towards the center of the stereographic lens 116. The higher rate of change of the position of the image point at the edge of the image increases the prediction horizon and allows the image processor 118 sufficient time to discern movement between consecutive images and determine cloud characteristics such as the cloud velocity, transmissivity, and direction. Moreover, the stereographic lens 116 captures images of the cloud 112 when the cloud 112 is near the horizon, thereby allowing the prediction system 102 sufficient time to compute cloud characteristics and subsequently predict irradiance and power output, such as the electric power output, of the solar panels 101 that are occluded by the cloud 112.

With returning reference to FIG. 1, in some embodiments, the sky imager 114 may be mounted on a swivel or rotation mechanism (not shown). The swivel mechanism allows the sky imager 114 to change its viewable area and acquire images of the sky beyond the field of view of the stereographic lens 116. In other embodiments, the sky imager 114 may further include a shading mechanism (not shown) configured to shield the sky imager 114 from direct sunlight, thereby preventing any saturation and/or distortion of the captured images usually caused by an excess of direct solar radiation impinging on the sky imager 114. It may be noted that these mechanisms are supplemental to the operation of the solar plant 100 or the prediction system 102.

The images captured by the sky imager 114 may be transmitted to the image processor 118. In accordance with aspects of the present disclosure, the image processor 118 may be configured to determine image information corresponding to each pixel in the captured image. For example, the image processor 118 may determine image information, such as, but not limited to, pixel values such as intensity, saturation, and hue information for each pixel in the image. Further, the image processor 118 may also be configured to remove any artifacts in the captured images and/or perform other known functions on the captured images to enhance the quality of the images. By way of example, the image processor 118 may evaluate the color and brightness data of a given pixel, compare this information with data corresponding to neighboring pixels and use a demosaicing algorithm to produce an appropriate color and brightness value for the pixel. The image processor 118 may also assess the captured images to estimate the correct distribution of contrast in the images. For instance, based on the time or day and other such factors, the image processor 118 may be configured to determine an optimal contrast value for the entire captured image.

Furthermore, it may be noted that in some cases the sun may blur images or introduce artifacts in the images. To overcome such flaws, in one embodiment, the image processor 118 may be configured to determine image information using multiple images. For example, the sky imager 114 may be configured to capture multiple images of the sky with different exposure times. The image processor 118 may then be configured to combine the clear/sharp portions of these images into a single image having optimum image properties and relatively fewer or no artifacts.

The image information for each pixel so determined by the image processor 118 may be communicated to the cloud characterizer 120. In one embodiment, the cloud characterizer 120 may be configured to determine cloud characteristics based on the pixel values. The cloud characteristics may include cloud movement, velocity, type, transmissivity, and so on. Particularly, the cloud characterizer 120 may be configured to determine cloud positions by comparing the pixel intensity values for various pixels. For example, if the cloud characterizer 120 determines that a number of neighboring pixels have substantially similar intensity values and that the intensity values are above a determined threshold value, the cloud characterizer 120 may be configured to categorize this cluster of pixels to be representative of a cloud. Subsequently, based on the number of pixels present in the cluster of pixels, the cloud characterizer 120 may be configured to determine the cloud size and/or the cloud position at a particular time. Moreover, the cloud characterizer 120 may be configured to determine the cloud velocity and/or the direction of movement of the cloud based on the difference in position of the cluster of pixels in previous images and in the current image. In some embodiments, the cloud characterizer 120 may also be configured to determine the type of cloud and the cloud transmissivity based on the saturation, intensity and hue information of the pixels. Clouds may be of varying nature, some examples of cloud type include cirrus clouds and cumulus clouds.

The output from the cloud characterizer 120, such as the cloud type, the velocity, the direction of movement, and the cloud size may be communicated to the irradiance predictor 122. In one embodiment, the irradiance predictor 122 may be configured to predict/estimate the time taken by the cloud 112 to occlude the solar panels 101 and/or the time taken by the cloud 112 to pass over the solar panels 101. To this end, the irradiance predictor 122 may be configured to determine the relative position of the sun 110 with respect to the solar panels 101 and the cloud 112. Moreover, the irradiance predictor 122 may also be configured to estimate the time taken by the cloud 112 to be positioned between the sun 110 and the solar panels 101. Further, based on cloud properties such as thickness, height, transmissivity, and cloud type, the irradiance predictor 122 may be configured to estimate a drop in irradiance if the cloud 112 were to occlude the solar panels 101. In addition, the irradiance predictor 122 may be configured to estimate the duration for which the irradiance levels may drop below a threshold level. For instance, if a thick low cloud were disposed between the sun 110 and the solar panels 101, the irradiance may decrease by up to 70%. However, if a high scanty cloud enters the space between the sun 110 and the solar panels 101, the irradiance level may drop by only 10%.

The predicted irradiance values may be transmitted to the power calculator 124. The power calculator 124 may be configured to predict the power output of the associated solar panels 101 for the period during which the cloud 112 occludes the solar panels 101. For example, based on the drop in irradiance and other plant properties such as solar panel characteristics and temperature of individual solar panels, the power calculator 124 may be configured to determine the electric power output of the solar panels 101 when the occlusion event occurs. These predicted power output values may be provided to the plant controller 106. In one embodiment, the plant controller 106 may be configured to continuously receive power output values from one or more power calculators 124 in the solar plant 100. Alternatively, the plant controller 106 may receive the power output values from the power calculator 124 at determined intervals, such as five-minute intervals, for example. Based on the predicted power output of each solar panel 101 in the solar plant 100, the plant controller 106 may be configured to control operation of the solar plant 100. By way of example, if the cloud 112 is a light cloud that reduces irradiance for one or more solar panels 101 by about 20% for about 1 minute and in turn reduces the output power of the solar panel 101 by 20%, the plant controller 106 may be configured to perform load management on the solar panels 101 or allow the solar panels 101 to provide the lower output power to the output grid 108. Alternatively, if it is predicted that a number of large clouds will occlude multiple solar panels 101 and hence reduce the irradiance received by the solar plant 100 by about 80% over 10 minutes, the plant controller 106 may be configured to power on an auxiliary power source 104 for this duration to compensate for the reduction in power generated by the solar panels 101.

In another embodiment, the predicted power output values may be provided to a grid operator. The grid operator may include a computing system and/or one or more manual operators. The grid operator may manually and/or automatically modify grid operations based on the predicted power output values. For example, the grid operator may choose to utilize electricity from another plant for the duration of the occlusion event. It will be understood that the solar plant 100 may include other elements such as inverters, boosters, controllers, switches, switchgears, and other such elements (not shown) for coupling the solar plant 100 to the output grid 108 and/or for proper functioning of the plant 100.

FIG. 6 is a flowchart 600 illustrating an exemplary method for predicting power output of a solar plant based on cloud characteristics such as cloud movement. In one embodiment, the method includes the steps of capturing images of the sky, calculating cloud characteristics using the sky images, predicting irradiance, calculating power output of one or more solar panels in the solar plant, and controlling operation of the solar plant based on the calculated power output of the solar panels. It will be understood that this method may be a continuous process or an intermittent process without departing from the scope of the present disclosure. The method of FIG. 6 is described with reference to the elements of FIG. 1.

In one example, the method starts at step 602 where one or more substantially planar images of the sky are captured. In accordance with aspects of the present disclosure, the sky imager 114 is configured to capture one or more images of the sky using the exemplary customized lens 116, continuously, periodically, or at determined times. Moreover, the sky imager 114 may capture one or more images of the sky with different exposure times. Furthermore, as previously noted, the customized lens 116 has a projection map given by equation (1). It will be understood that, in other embodiments, other approximations of equation (1) that produce substantially similar results may be employed without departing from the scope of the present disclosure. In a particular embodiment, the stereographic lens 116, having a projection map given by equation (2), may be utilized. With such a projection map, the stereographic lens 116 may be configured to produce a substantially planar image of the sky that includes low lying horizon clouds.

Furthermore, as previously noted, the image processor 118 may be configured to determine image information for each pixel and/or enhance image quality such as contrast, brightness, and so on. Subsequently, this pixel information is transmitted to the cloud characterizer 120, for example.

Moreover, at step 604, cloud characteristics may be computed. In one example, the cloud characteristics may be computed based on the pixel information. The pixel information may include information related to clusters of pixels having substantially similar pixel intensities, pixel color information, and/or movement of such pixel clusters between consecutive images. In one embodiment, the cloud characterizer 120 may be configured to determine the cloud size, position, transmissivity, velocity, and direction of movement based on this pixel information. For example, if the pixel cluster moves by 10 pixels to the right between two consecutive images captured at five-second intervals, the cloud characterizer 120 may determine that the cloud moves at a rate of 2 pixels per second. This calculated rate of change in pixel position may be converted into angular velocity of the cloud using equations (2) and/or (3).

In one embodiment, the cloud characterizer 120 may be configured to transmit the cloud characteristics to the irradiance predictor 122 continuously in real time. In other embodiments, the cloud characterizer 120 may communicate the cloud characteristics to the irradiance predictor 122 only if the cloud characterizer 120 determines that one or more clouds are headed in the direction of the one or more solar panels 101 in the solar plant 100.

Subsequently, at step 606, irradiance may be predicted based on the determined cloud characteristics. For instance, the irradiance predictor 122 may be configured to predict the amount of irradiance one or more solar panels 101 may receive when one or more clouds 112 are positioned between the sun 110 and the solar panels 101. To this end, the irradiance predictor 122 is configured to utilize information such as type of cloud, cloud height, velocity, movement direction, size, and so on. In some embodiments, the irradiance predictor 122 may compute the reduction in irradiance when the cloud 112 passes over the solar panels 101. In other embodiments, the irradiance predictor 122 may be configured to compute the total irradiance received by the solar panels 101 when the cloud 112 passes over.

In addition, at step 608, a power output of the solar panels 101 may be determined. Particularly, the electric power output may be determined based on the predicted irradiance. Along with the predicted irradiance, other factors and characteristics such as, but not limited to, properties and temperature of the solar panels 101 may be taken into account while determining the power output. For instance, the power calculator 124 may be configured to determine the power output of the associated solar panel(s) 101 based on the predicted irradiance, solar panel properties, and/or ambient temperature when the cloud 112 occludes the solar panels 101.

Furthermore, at step 610, operation of the solar plant 100 may be controlled based on the computed power output. To that end, the estimated power output from the one or more prediction systems 102 in the solar plant 100 may be provided to the plant controller 106. If it is determined that the total power output of the solar plant 100 is lower than a threshold value determined by the plant controller 106, the plant controller 106 may be configured energize an auxiliary power source and/or increase/decrease the power of an energized auxiliary source, such as the auxiliary power source 104. Additionally, the plant controller 106 may be configured to ensure that the auxiliary power source 104 achieves a steady state condition prior to the cloud 112 occluding the solar panels 101. Alternatively, the plant controller 106 may be configured to utilize a battery source during these conditions. However, if it is determined that the power output is greater than the threshold value, the plant controller 106 may be configured to perform certain load shedding operations to cut-off electricity on certain grid lines. Such a situation may circumvent the need for any auxiliary power sources.

It will be understood that the operation of the prediction system 102 may vary in different embodiments of the system. For example, in some embodiments, the prediction system 102 may not utilize an image processor 118 for enhancing image quality. In other embodiments, the image processor 118 may be configured to determine the cloud characteristics and provide the information to a computing device that calculates irradiance and power output, and performs plant level control.

Furthermore, the foregoing examples, demonstrations, and process steps such as those that may be performed by the system may be implemented by suitable code on a processor-based system, such as a general-purpose or special-purpose computer, or a digital controller. It should also be noted that different implementations of the present technique may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in a data repository or memory.

The various embodiments of the exemplary systems and methods for predicting power output of a solar plant in the presence of clouds described hereinabove dramatically increase the efficiency of the prediction system. These systems detect cloud movement at the horizon more accurately than conventional fish-eye lenses and hemispherical mirrors. Further, use of the stereographic lens in the exemplary prediction systems facilitates a larger prediction horizon and faster computation of the cloud characteristics. Additionally, these systems allow faster prediction of irradiance, thus allowing the solar plant to implement plant control with minimum or no delays.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A prediction system for predicting solar irradiance based on cloud characteristics, the system comprising:
   a sky imager comprising a customized lens configured to capture one or more substantially planar images of the sky, wherein the customized lens has a projection map given by the equation:

$$R(\theta) = 2 \times f \times \frac{\sin\left(\frac{\theta}{2}\right)}{\cos\left(\frac{\theta}{2}\right)^{\gamma}}$$

or approximations thereof, wherein R is a position of an image point on an image sensor, f is the focal length of the customized lens, θ is an angle of observation, and γ is a constant, having a value between 0 and 1;
   an image processor coupled to the sky imager and configured to process the one or more substantially planar images;
   a computing system coupled to the image processor and configured to:
      detect cloud characteristics based on the one or more substantially planar images; and
      predict the solar irradiance based on the cloud characteristics.

2. The system of claim 1, wherein the customized lens is configured such that a rate of change of the position of an image point of a cloud moving horizontally and vertically towards the customized lens is greater at the circumference of the customized lens and lower towards the center of the stereographic lens.

3. The system of claim 1, wherein the customized lens is configured such that a rate of change of the position of an image point of a cloud moving horizontally towards the customized lens is substantially constant.

4. The system of claim 1, wherein the computing system comprises:
   a cloud characterizer configured to detect the cloud characteristics, wherein the cloud characteristics comprise one or more of cloud movement, cloud velocity, cloud movement direction, cloud transmissivity, or cloud type; and
   an irradiance predictor configured to predict solar irradiance based on the cloud characteristics.

5. The system of claim 1, wherein the prediction system is configured to determine power output of one or more solar panels in a solar plant.

6. The system of claim 5, wherein the computing system comprises a power calculator configured to determine the power output of the solar plant based on the predicted solar irradiance.

7. The system of claim 6, further comprising a controller configured to control operation of the solar plant based on the determined power output.

8. A prediction system, comprising:
   a sky imager comprising a customized lens having a projection map given by the equation:

$$R(\theta) = 2 \times f \times \frac{\sin\left(\frac{\theta}{2}\right)}{\cos\left(\frac{\theta}{2}\right)^{\gamma}}$$

or approximations thereof, wherein R is a position of an image point on an image sensor, f is the focal length of the customized lens, θ is an angle of observation, and γ is a constant, such that γ has a value between 0 and 1.

9. The prediction system of claim 8, wherein the customized lens is configured to capture substantially planar images of the sky.

10. The prediction system of claim 8, further comprising at least one of a rotation mechanism configured to swivel the sky imager, and a shading mechanism configured to prevent at least a portion of direct sunlight from impinging on the customized lens.

11. A method for predicting power output of one or more solar panels in a solar plant based on cloud characteristics, the method comprising:
   capturing a plurality of images of the sky using a customized lens having a projection map given by equation:

$$R(\theta) = 2 \times f \times \frac{\sin\left(\frac{\theta}{2}\right)}{\cos\left(\frac{\theta}{2}\right)^{\gamma}}$$

or approximations thereof, wherein R is a position of an image point on an image sensor, f is the focal length of the customized lens, θ is an angle of observation, and γ is a constant, such that γ has a value between 0 and 1;
   determining cloud characteristics based on the plurality of captured images;
   predicting solar irradiance corresponding to the one or more solar panels based on the determined cloud characteristics; and
   calculating the power output of the one or more solar panels based on the predicted solar irradiance.

12. The method of claim 11, further comprises determining image information corresponding to a plurality of pixels in the plurality of captured images.

13. The method of claim 12, wherein determining cloud characteristics comprises identifying one or more clouds based on the determined image information.

14. The method of claim 13, wherein predicting solar irradiance comprises:
   determining cloud movement based on the determined cloud characteristics of the one or more clouds;
   determining a size of the one or more clouds based on the determined cloud characteristics;
   determining transmissivity of the one or more clouds based on the determined cloud characteristics; and
   predicting a time interval during which the one or more clouds occlude the one or more solar panels in the solar plant.

15. The method of claim 11, further comprising controlling operation of the solar plant based on the calculated power output.

16. The method of claim 15, wherein controlling operation of the solar plant comprises:
   comparing the predicted power output with a threshold power output value; and
   employing an auxiliary power source based on the predicted power output.

17. A non-transitory computer-readable medium storing computer executable code to perform the method of:
   capturing a plurality of images of the sky using a customized lens having a projection map given by equation:

$$R(\theta) = 2 \times f \times \frac{\sin\left(\frac{\theta}{2}\right)}{\cos\left(\frac{\theta}{2}\right)^{\gamma}}$$

or approximations thereof, wherein R is a position of an image point on an image sensor, f is the focal length of the customized lens, $\theta$ is an angle of observation, and $\gamma$ is a constant, such that $\gamma$ has a value between 0 and 1;
   determining cloud characteristics based on the plurality of captured images;
   predicting solar irradiance corresponding to one or more solar panels based on the determined cloud characteristics; and
   calculating the power output of the one or more solar panels based on the predicted solar irradiance.

* * * * *